United States Patent
Hemmenway et al.

[19]

[11] Patent Number: 5,920,108

[45] Date of Patent: Jul. 6, 1999

[54] LATE PROCESS METHOD AND APPARATUS FOR TRENCH ISOLATION

[75] Inventors: Donald Frank Hemmenway, Melbourne; Lawrence George Pearce, Palm Bay, both of Fla.

[73] Assignee: Harris Corporation, Melbourne, Fla.

[21] Appl. No.: 08/745,104

[22] Filed: Nov. 7, 1996

Related U.S. Application Data

[60] Continuation of application No. 08/462,173, Jun. 5, 1995, abandoned, which is a division of application No. 08/259,863, Jun. 15, 1997, abandoned.

[51] Int. Cl.⁶ .................................................. H01L 29/02
[52] U.S. Cl. ........................ 257/508; 257/520; 257/501; 257/347
[58] Field of Search .................................. 257/347, 348, 257/349, 350, 351, 352, 353, 354, 501, 506, 507, 510, 513, 520, 508

[56] References Cited

U.S. PATENT DOCUMENTS

| | | | |
|---|---|---|---|
| 4,140,558 | 2/1979 | Murphy et al. | 148/175 |
| 4,631,803 | 12/1986 | Hunter et al. | 29/576 |
| 4,884,117 | 11/1989 | Neppl et al. | 257/520 |
| 4,987,471 | 1/1991 | Easter et al. | 257/347 |
| 5,027,184 | 6/1991 | Soclof | 257/506 |
| 5,100,830 | 3/1992 | Morita | 437/64 |
| 5,135,883 | 8/1992 | Bae et al. | 257/308 |
| 5,173,436 | 12/1992 | Gill et al. | 437/43 |
| 5,200,348 | 4/1993 | Uchida et al. | 437/33 |
| 5,217,919 | 6/1993 | Gaul et al. | 437/67 |
| 5,241,211 | 8/1993 | Tashiko | 257/347 |
| 5,315,144 | 5/1994 | Cherne | 257/351 |
| 5,434,446 | 7/1995 | Hilton et al. | 257/507 |
| 5,668,397 | 9/1997 | Davis et al. | 257/517 |

FOREIGN PATENT DOCUMENTS

| | | | |
|---|---|---|---|
| 55411 | 7/1982 | European Pat. Off. . | |
| 221394 | 5/1987 | European Pat. Off. . | |
| 61-30046 | 2/1986 | Japan . | |
| 61-214446 | 9/1986 | Japan . | |
| 3-234041 | 10/1991 | Japan . | |
| 3-290948 | 12/1991 | Japan . | |
| 4-48647 | 2/1992 | Japan | 257/520 |
| 4-111445 | 4/1992 | Japan . | |
| 4-130764 | 5/1992 | Japan | 257/350 |
| 4-159719 | 6/1992 | Japan . | |
| 4-209551 | 7/1992 | Japan . | |
| 4-259239 | 9/1992 | Japan . | |
| 5-121705 | 5/1993 | Japan | 257/354 |
| 5-166823 | 7/1993 | Japan . | |
| 5-166921 | 7/1993 | Japan . | |
| 6-77446 | 3/1994 | Japan | 257/347 |
| 85/04516 | 10/1985 | WIPO . | |

*Primary Examiner*—David B. Hardy
*Attorney, Agent, or Firm*—Jaeckle Fleischmann & Mugel, LLP

[57] ABSTRACT

Trenches 72 are formed in substrate 17 late in the fabrication process. In order to avoid trench sidewall stresses that cause defects in the substrate monocrystalline lattice, the trenches are filled after a final thick thermal oxide layer, such as a LOCOS layer 25, is grown. The trenches 72 are also filled after a final deep diffusion, i.e. a diffusion in excess of one micron.

5 Claims, 4 Drawing Sheets

LATE PROCESS METHOD AND APPARATUS FOR TRENCH ISOLATION

This application is a continuation of application Ser. No. 08/462,173, filed on Jun. 5, 1995, now abandoned, which is a divisional of Ser. No. 08/259,863, filed on Jun. 15, 1994, now abandoned.

This invention relates in general to a method and apparatus for trench isolation and, in particular, for providing trench isolation after completion of a final thick thermal oxidation step and a final deep diffusion step.

BACKGROUND

An integrated circuit includes one or more regions or layers of conductive material that are isolated from other conductive regions or conductive layers. Such isolation may be in the form of junction isolation by juxtaposing such regions or layers of different doping next to one another. Isolation can also be achieved dielectrically by providing a dielectric region, layer, or structure between selected conductive regions and between selected transistors or other devices in the integrated circuit. In certain devices, the entire integrated circuit is insulated from bulk substrate material by providing a buried dielectric layer. Such devices are termed silicon-on-insulator or SOI devices due to a buried insulative layer which isolates the active devices from the bulk silicon of the substrate.

Certain SOI devices may also be formed using a bonded wafer technique. With that technique, a device wafer is bonded to a silicon dioxide surface layer of a handle wafer. Thus, the bonded wafer has a buried dielectric layer beneath the device wafer.

While the above SOI techniques provide for vertical electrical dielectric isolation, other techniques laterally insulate adjacent transistors or devices. One such technique provides trenches around the devices. The trenches are patterned in the surface of the semiconductor substrate in which devices are formed or are to be formed. Such prior art trench isolation processes are performed early in the process of fabricating an integrated circuit, prior to the major diffusions that form the transistors and other devices and before completion of thick thermal oxide growth. The trenches are filled with dielectric material and polysilicon. In U.S. Pat. No. 4,140,558, the trench in the substrate is filled with an oxide provided by thermal oxidation of the substrate material that forms the walls and floor of the trench. In U.S. Pat. No. 5,217,919, the trench in the substrate is filled with a thermal oxide during the step of local thermal oxidation. Such a so-called LOCOS step is generally performed after substantial diffusions form larger regions of the devices, e.g. after formation of the collector regions in bipolar devices or after the formation of well regions in MOS devices. LOCOS is a common step in the fabrication of many, but not all, devices. However, most devices include a step of thermal oxidation where an oxide layer is grown and the thickness of the oxide layer exceeds 500 Angstroms.

Such prior art techniques have encountered or been the source of problems. Since the oxide that seals the sidewalls of the trench is thermally grown early in the prior art fabrication of the integrated circuit, the exposed top surface of the sidewall oxide is subject to etching that occurs later in the fabrication processes. In some cases an oxide etch may remove trench sidewall oxide, for example, in the complete oxide strip common before pad oxide growth in LOCOS processes. If the trench is filled with polysilicon or other material, the desired electrical insulation of the trench may be reduced and thereby affect [i.e., have an effect on] the overall reliability of the device. It has also been observed that crystal damage results from excess sidewall oxide growth. As pointed out above, the trench is formed and dielectrically isolated early in the fabrication of the integrated circuit. However, the oxide in the filled trench (particularly the oxide at the exposed top surface) will continue to grow when the wafer is subject to subsequent thermal oxide processes, e.g., the LOCOS step. During thermal oxidation, the substrate material, typically silicon, combines with oxygen to form silicon dioxide. So, each oxidized silicon atoms grows by the volume of two oxygen atoms. A molecule of silicon dioxide has approximately twice the volume of an atom of silicon. Such thermal oxidation effectively doubles the volume of the silicon. If the trench sidewall oxide growth is excessive, mechanical stresses are created by the trench oxide expansion and those stresses generate crystalline lattice defects in adjacent silicon device regions. Such defects increase device leakage and reduce overall yield. Such excess thermal oxide growth may also occur during any high temperature processing step such as diffusions and drive in of implants.

Still another problem encountered with early trench isolation has been the necessity to fill the trench with polysilicon. Once that occurs, the substrate must be mechanically planarized to render the polysilicon-filled trenches level with the adjacent oxide layer.

SUMMARY

The invention overcomes the disadvantages of the prior art techniques by providing lateral trenches relatively late in the device fabrication process. In this regard, late in the process means that the trenches are formed and filled after those steps in the process which can create trench-related silicon defects, such as deep diffusion or thick thermal oxidation steps. To this end, a thick thermal oxide is defined as a layer of thermal oxide greater than 500 Angstroms and a deep diffusion is one in which the dopant species penetrates a surface by one micron or more. The trenches and the substrate itself will not be subject to further deep diffusions of more than one micron penetration after the trenches have been formed and filled. So, the trench is formed and filled beyond the completion of the LOCOS step or after other steps requiring growth of thermal oxide in excess of 500 Angstroms. As such, the trench is made through the LOCOS isolation or other thermal oxide layers down to a buried dielectric layer, a buried conductive layer or to a predetermined depth.

It is also a feature of this invention that the open trench may be doped with a suitable material to render the sidewalls of the trench conductive. The latter is particularly helpful in providing a contact to a buried layer conductive region, such as typically used in bipolar transistors. In a similar manner, the walls of the trench may be implanted or silicided in order to provide contact to a buried conductive region.

As such, the inventive process includes a series of steps. As a first step, a semiconductor substrate is provided having first and second surfaces. On a first or upper surface, semiconductor device regions are formed. In an MOS device, the regions include the source, the drain, and the gate; in a bipolar device the regions include base, emitter, and collector. The semiconductor substrate is provided with a dielectric insulating layer spaced from the first surface. This layer, typically known as a buried oxide layer, may be formed by a SIMOX process or be provided by a bonded wafer process.

In a typical semiconductor process flow using the invention, a number of steps are performed before the trench is opened and filled. The initial steps include the formation of deep diffusion layers in the substrate. Such layers include the collector diffusion for bipolar devices and the well diffusions for MOS devices. Thereafter, the substrate may be subject to one or more thick (in excess of 500 Angstroms) thermal oxidations, including a LOCOS oxidation step that forms a field oxide layer. The LOCOS process, used in some but not all devices, electrically isolates. one transistor from an adjoining transistor.

Following a LOCOS step, there may be a number of further steps before the trench is made and filled. Such further steps typically include forming intermediate or mid-level diffusions, depositing a polysilicon layer to form electrodes such as the gates of MOS transistors or the emitters of bipolar transistors. A typical mid-level diffusion would include lightly doped drain implants for MOS transistors and base implants for bipolar transistors. In a DMOS device the diffusion for the channel region would normally be done before the trench was formed and filled. The sources and drains for MOS transistors may be formed either before or after the trenches are made and filled, so long as the required source/drain diffusion is one micron or less. If the source/drain region requires a depth greater than one micron, then the region is formed before the trench is filled.

The trench is formed by masking and etching regions on the upper semiconductor surface in order to establish a trench down to a predetermined depth or other buried layer such as a buried oxide layer or a buried conductive layer. Once the trench is open, the walls of the trench may be either doped with a suitable dopant, implanted or silicided to increase their conductivity. Thereafter, the walls of the trench are sealed with a thermal sidewall oxide of typically about 500 Angstroms thickness. The trench may be filled at any suitable time after it is formed. While the trench is still open, one may do further thermal oxidations and perform other process steps because the volume expansion associated with thermal oxidation will not create significant stress in an open trench. The rest of the trench is normally filled with polysilicon and/or other dielectrics such as deposited silicon dioxide.

One of the advantages of this invention is that later process steps normally include depositions to form field oxides, interlevel dielectric layers and surface electrodes. So, the trench can be filled simultaneously while other portions of the substrate receive suitable depositions. The sidewall of the trench may be oxidized at the same time a gate oxide is grown. The oxidized trench may be filled with polysilicon that also will form the gate or emitter electrodes. After the trench is filled, the substrate will not be subjected to any further thick thermal oxidation steps or deep diffusions. In this context, a thick thermal oxidation step is a thermal oxidation which grows a layer of thermal oxide having a thickness of 500 or more Angstroms. Such thick layers cause stress in the sidewall oxides which in turn cause defects in the crystalline lattice of the substrate. A deep diffusion step is one in which a dopant is diffused into the substrate a distance at or greater than one micron. Such depth of diffusion normally requires elevated temperatures that increase the growth of the trench sidewall oxides and create stress therein. After the trench is filled, the device may be completed by providing further diffusions or implants to form emitter regions in bipolar devices, or source and drain regions in MOS devices, for example, provided that these operations entail less than 500 Å of thermal oxidation and less than 1 μm of dopant penetration.

DETAILED DESCRIPTION

Figure 1:
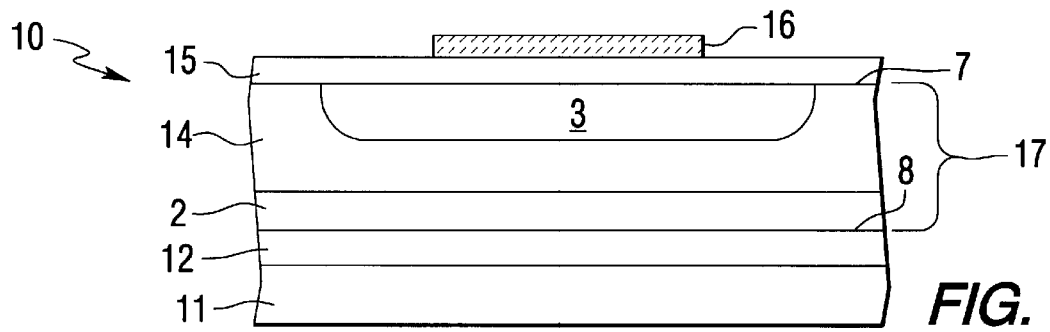
FIGS. 1–9 illustrate sequential steps in the formation of an MOS device (a NMOS device in this case; the process for a PMOS device would be similar) using a first method for etching the trenches.

With reference to FIG. 1, there is shown a semiconductor substrate 17, also termed a device wafer. Substrate 17 may be made of any suitable semiconductor material including germanium, gallium-arsenide, or silicon. Silicon is the most widely used semiconductor material. As such, a further description of this example of the invention will be given using silicon as an exemplary material for the device wafer 17. The device wafer 17 has a deep, buried, heavily doped layer 2, typically an n+ layer and a lightly doped n-type layer 14 above it (for the case of a NMOS transistor). Another deep diffusion of opposite conductivity forms a p-well 3.

The device wafer 17 has first and second surfaces 7, 8, respectively. On surface 8 there is an insulating layer 12, typically a layer of silicon dioxide. The layer 12 may be formed in the device wafer 17, or may be bonded to the second surface 8 of device wafer 17 via one or more bonding processes such as those shown and described in U.S. patent application Ser. Nos. 900,202, filed Jun. 17, 1992, or 935,765, filed Aug. 26, 1992, and assigned to Harris Corp. If such a bonding process is used, the silicon dioxide surface 12 is first formed on a handle wafer 11 which is also made of silicon or other suitable material capable of carrying an insulating layer. At the step shown in FIG. 1, a pad oxide 15 is thermally grown on the first surface 7 of the device wafer 17. On top of the pad oxide 15 is a further insulator such as silicon nitride mask 16. A silicon nitride layer is uniformly deposited, patterned and selectively removed to provide the mask 16 as shown in FIG. 1. In general, either MOS transistors as described herein or bipolar transistors as described hereinafter will be formed beneath the silicon nitride mask 16 in the device wafer 17.

Figure 2:
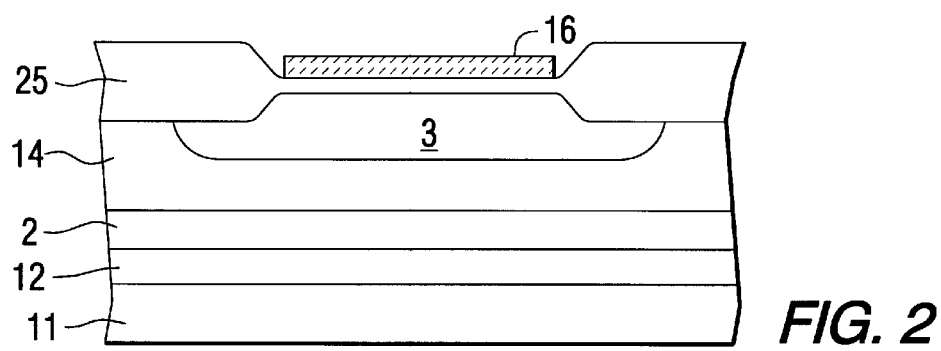

The silicon nitride mask 16 is formed over the pad oxide 15 in preparation of the step of local oxidization, i.e. LOCOS. The LOCOS step is shown in FIG. 2. During LOCOS, a predetermined thickness of silicon oxide 25 in the range of 10,000 to 15,000 Angstroms is grown on the device wafer 17. During the LOCOS step, the wafer 17 is exposed to steam and temperatures in excess of 800° C. Such a thermal oxidation process consumes silicon in the surface 7 of device wafer 17 in the regions beyond silicon nitride mask 16 to form oxide layer 25.

Figure 3:
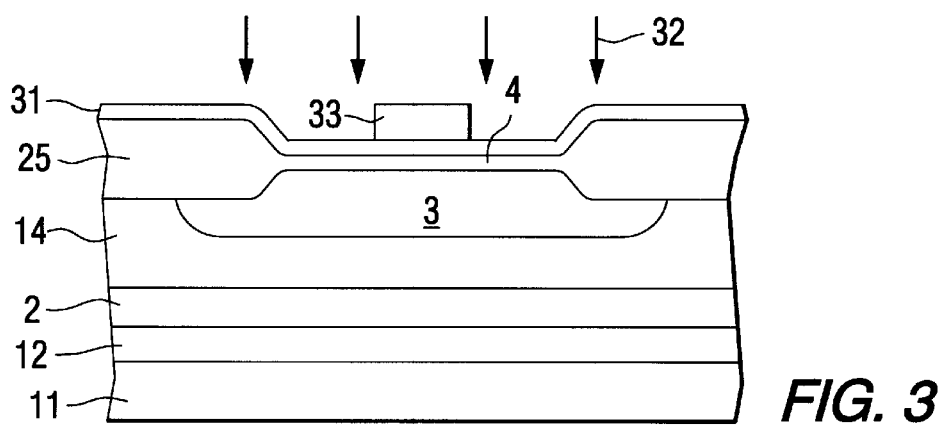
Figure 4:
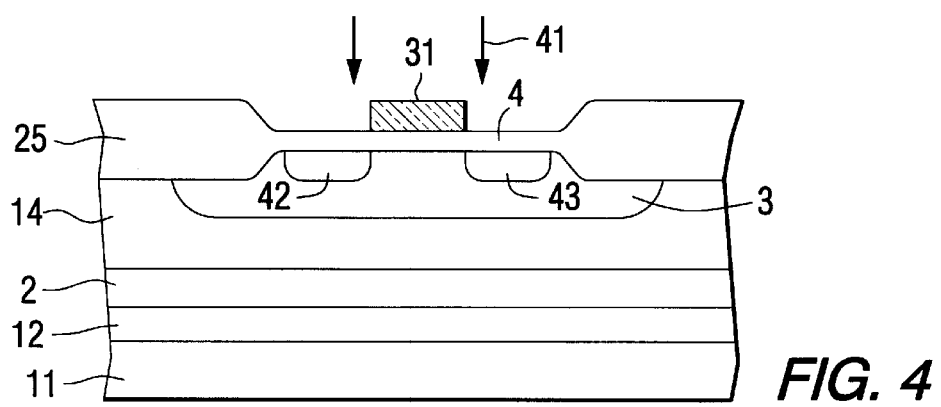

After completion of the LOCOS oxidation step, the silicon nitride mask 16 and the pad oxide 7 are stripped. As shown in FIG. 3, a gate oxide 4 is grown on the surface 7 and a layer 31 of polysilicon is deposited over the gate oxide 4, and the LOCOS layer 25. The polysilicon layer 31 is either deposited as doped polysilicon or is later implanted or diffused as shown by arrows 32 with a suitable implant or diffusion to render the layer 31 suitably conductive in order to form polysilicon gates in MOS devices. Thereafter, the polysilicon layer 31 is masked with a layer 33 of photoresist and the unmasked portion of layer 31 is removed leaving the polysilicon gate 31 as shown in FIG. 4.

Source and drain regions 42, 43 are next formed by suitable implants or diffusions 41. In a typical NMOS device, the dopant will be arsenic and the depth of the diffusions 42, 43 below the surface 7 of device wafer 17 will be in an order of less than one micron. As such, the source and drain implants could be made after the trench is formed and filled.

Figure 5:
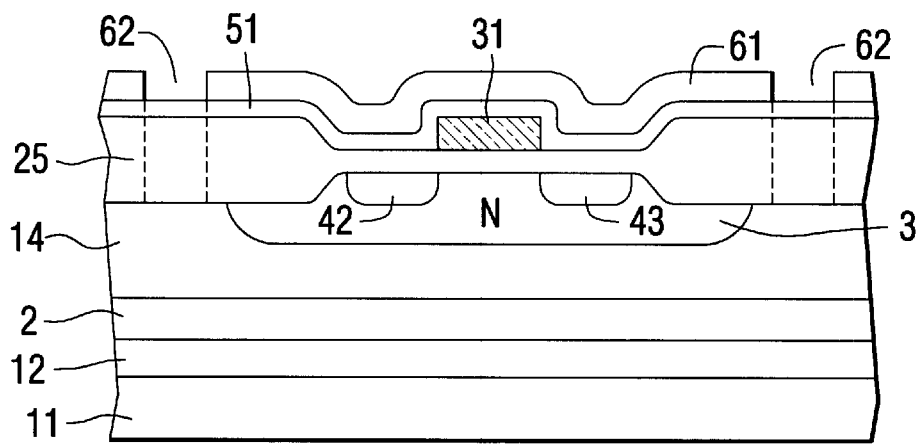
Figure 6:
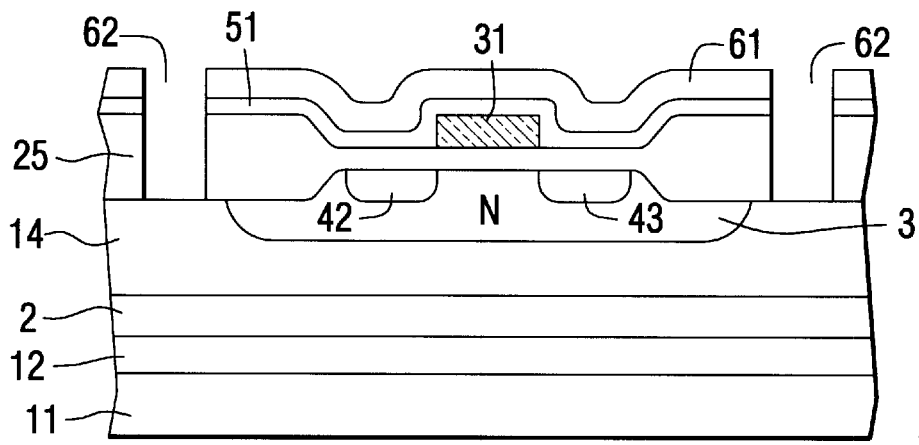
Figure 7:
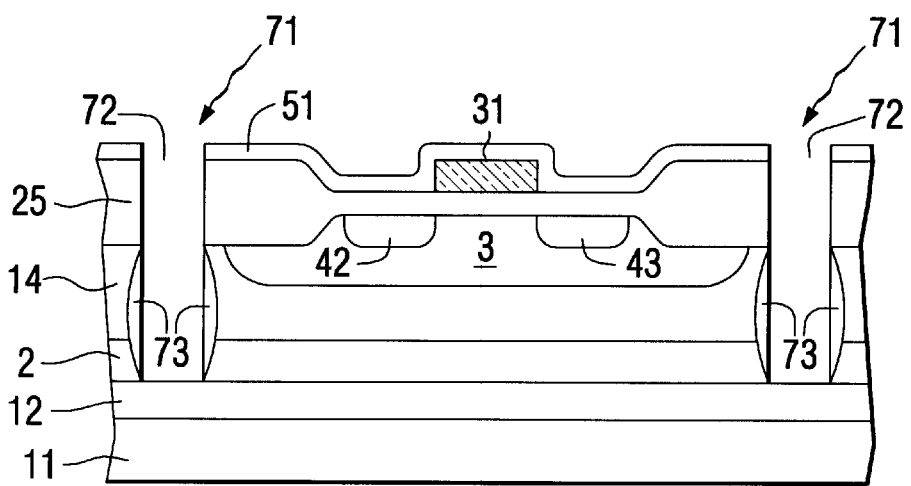

The sequential steps illustrated in FIGS. 5–7 are preferably performed on a P-5000 etching apparatus made by Applied Materials. That apparatus has a high selectivity for etching silicon and not removing silicon dioxide. However, any other apparatus with such suitable high selectivity may be used. The desired selectivity is about 100:1 or greater of silicon vs. silicon dioxide. A conformal layer 51 of spacer oxide is deposited over the surface of the device wafer 17. The spacer oxide layer is commonly used in MOS processes to space the source and drain implants from the active channel region, thereby creating lightly doped source and drain regions (LDD's). Thereafter, a photoresist layer 61 is conformally coated on spacer oxide layer 51. Photoresist layer 61 is then patterned to define trench opening 62. The photoresist layer 61 acts as a mask while the portions of the oxide layers 51 and 25 exposed in opening 62 are removed by a dry plasma etch. The silicon 14 in the wafer 17 acts as an etch stop for the oxide etchant. The photoresist is then stripped off. A second dry etch operation with high silicon-to-oxide etch selectivity, for example using the P5000 etch apparatus, is used on the structure shown in FIG. 6 in order to etch the substrate material down to the buried oxide layer 12. After removal of the material from the trenches 72, if desired, the trenches 72 may have their sidewalls doped with a suitable material to render the sidewalls of the trench conductive, as shown in FIG. 7. The latter is accomplished, for example, by exposing the trenches 72 to a suitable phosphorous containing gas such as $POCl_3$ 71 or by siliciding the sidewalls of trenches 72 using one or more known techniques such as reacting the trenches with titanium or platinum to form silicides. The sidewalls could also be implanted at an angle to render them conductive. The doped area 73 in the trenches may be used to provide suitable contacts to buried layer 2 in the bulk material 14.

Figure 8:
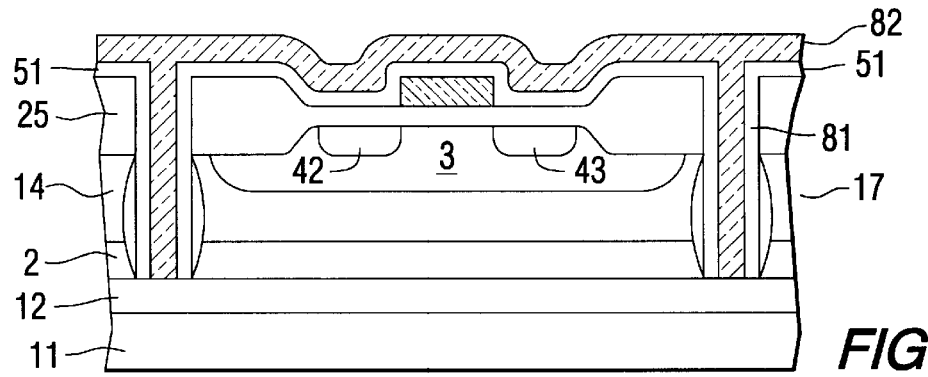
Figure 9:
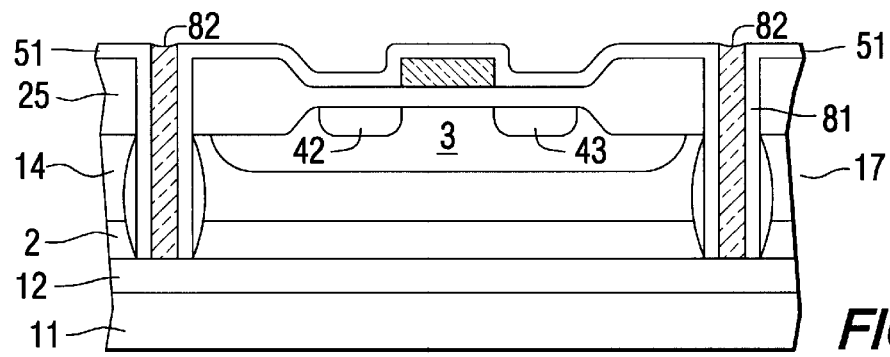
Figure 10:
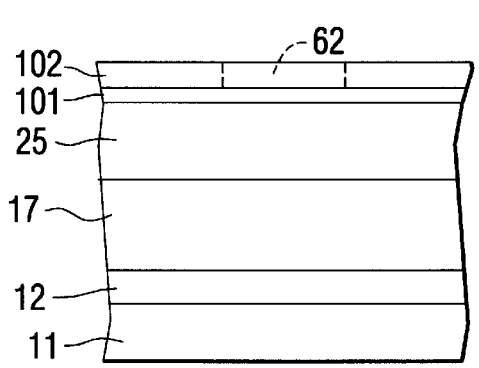
FIGS. 10–15 illustrate sequential steps in an alternate method for etching the the trenches.
Figure 11:
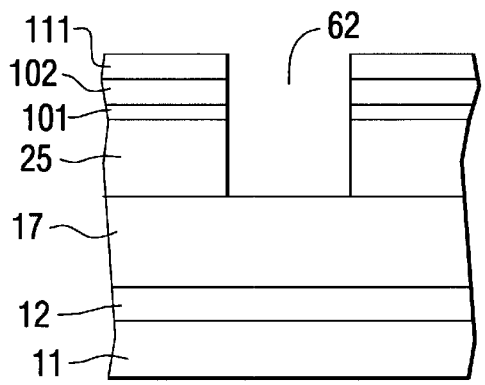

At a suitable time after completion of trench formation, the trench is closed and filled with material. A number of other processing steps may be performed before the trench is filled. It is preferable to at least seal the sidewalls of the trench with a sidewall oxide. In general the sidewall oxide 81 is thermally grown on the sidewalls of the trenches to a thickness at or less than 500 Angstroms (FIG. 8). The layer of sidewall oxide 81 becomes continuous with the surface spacer layer 51 of oxide. After the trenches are sealed, other deposition, diffusion and masking and etching steps may be performed. A trench filler material such as polysilicon layer 82 is conformally deposited on the surface of wafer 17 in order to fill the trenches 72. The polysilicon layer 82 outside the trenches 72 is etched away in order to reduce the top surface of layer 82 to approximately the same height as the spacer oxide 51 (FIG. 9).

If desired, the polysilicon layer 82 may also be used for the gate electrode. As such, the step of forming the gate oxide would precede the step of depositing polysilicon layer 82 and the layer 82 would be patterned to also remain over the gate oxide 4. The further processing of the device shown in FIG. 9 includes the provision of one or more metal layers and interlevel dielectric isolation layers including deposition of silicon dioxide layers. After the trenches are filled, no further thick thermal oxides are grown on the substrate, i.e. where the growth of the thermal oxide exceeds 500 Angstroms. Also, no further deep diffusions are made into the wafer 17, i.e. where the depth of the diffusion equals or exceeds 1 micron.

In carrying out the above process, the spacer layer 51 is approximately 3,500 Angstroms thick. One of the advantages of using the P-5000 process is that only a portion of the spacer oxide 51 is consumed in the process. That is, the process carried out by the P-5000 apparatus has high silicon-to-oxide etch selectivity. In effect, the spacer layer 51 serves dual purpose as a mask for the trench and an implant spacer oxide. With a better than 100:1 selectivity, less than 1500 Å of the spacer layer 51 is consumed during etching a trench of 15 microns, and the remaining spacer oxide provides the traditional function of spacing the source and drain implants from the active MOS channel region.

Prior art trenches made early in the process are usually filled in a separate, trench filling step. As a further alternative to filling trenches 72 with polysilicon, the trenches 72 may be filled with oxide deposited by one or more subsequent steps. Such steps include deposition of a field oxide layer for dielectrically separating the first level metal from the gate polysilicon. Another oxide deposition occurs between the deposition of two levels of metal. Most devices commonly have first and second levels of metal separated from each other by an interlevel dielectric layer of deposited silicon dioxide. The field oxide and interlevel metal dielectric depositions normally occur late in the process. As such, those later oxide deposition steps may be used to fill the trenches 72, thereby reducing the total number of steps needed for form a device.

It is advantageous to use such later oxide deposition steps since no additional planarization is needed. If the trench is filled with polysilicon, the polysilicon must be planarized before further processing. The later field oxide and interlevel dielectric layers are usually followed by a planarization step. If the trenches are filled during the deposition of field oxide or interlevel dielectric oxide, the trench fill can be planarized without the need for a separate step.

Figure 12:
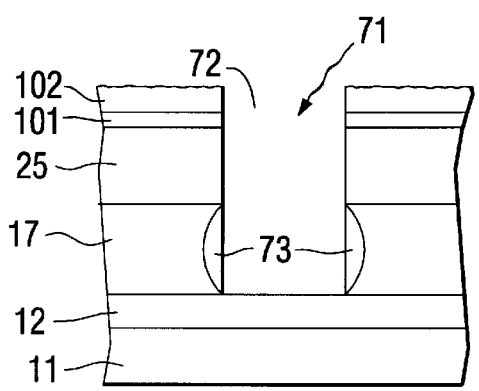
Figure 13:
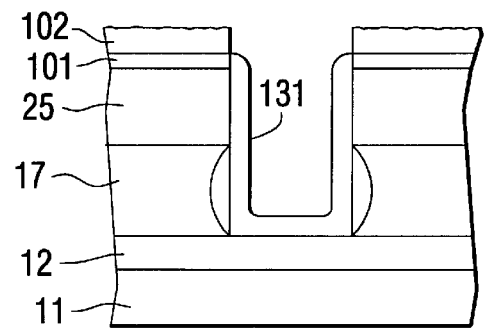
Figure 14:
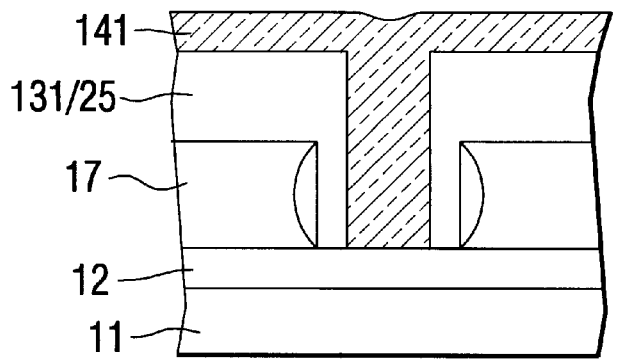
Figure 15:
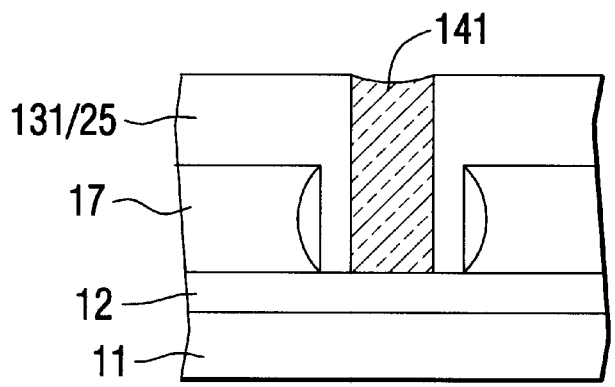

Another process and apparatus with less selectivity may be used to provide suitable trenches in accordance with the invention. The process may be carried out, for example, on a Drytek machine that has a silicon to oxide etch selectivity of about 15–20:1. Such a process is illustrated in FIGS. 10–15. In that process, only the substrate and oxide and masking regions are shown. So, with reference to FIG. 10, the LOCOS oxide layer 25 is first coated with a layer of polysilicon 101 which will act as an etch stop. The layer 101 is approximately 1500 to 2000 Angstroms in thickness. A hardmask layer 102 of silicon dioxide is deposited on the polysilicon layer 101. On top of the hardmask layer 102 is a photoresist layer 111. Photoresist layer 111 is suitably patterned to provide trench opening 62. The trench opening 62 is etched through the hardmask 102 to stop on the polysilicon etch stop 101. Thereafter, the polysilicon layer 101 is suitably etched to expose the LOCOS oxide layer 25. The LOCOS oxide layer 25 is then likewise etched. The photoresist layer 111 is then stripped off. Finally, the silicon substrate 17 is etched using the hardmask layers as a trench pattern. During etching of the LOCOS layer 25, the hardmask layer 102 of deposited oxide is also substantially consumed due to the low etch selectivity. The latter is shown in FIG. 12. Once the trench 72 has been opened to the buried insulating layer 12, the trench walls may be suitably doped by a dopant such to form diffusion sidewalls 73 in the trench 72. Likewise, as mentioned above, the sidewalls of the trench may be silicided or implanted. Thereafter, as shown in FIG. 13, a thermal oxide layer 131 is grown to a thickness of about 500 Angstroms on the sidewalls of the trench and the hardmask 102 is suitably removed by anisotropic etching which preserves the sidewall oxide, stopping on etch stop layer 101. Thereafter, the polysilicon etch stop layer 101 is etched off. If desired, the trench 72 may be plugged with photoresist to protect the buried oxide layer 12 during removal of the hardmask 102. Thereafter, as shown in FIG. 14, layer 141 of polysilicon is conformably deposited to fill the trenches. The layer 141 is etched back in order to render the polysilicon generally planar with the surface of the LOCOS oxide 25. As an alternative, the trenches may be filled with a field oxide layer or an interlevel metal dielectric layer, which both already exist in the process.

Figure 16:
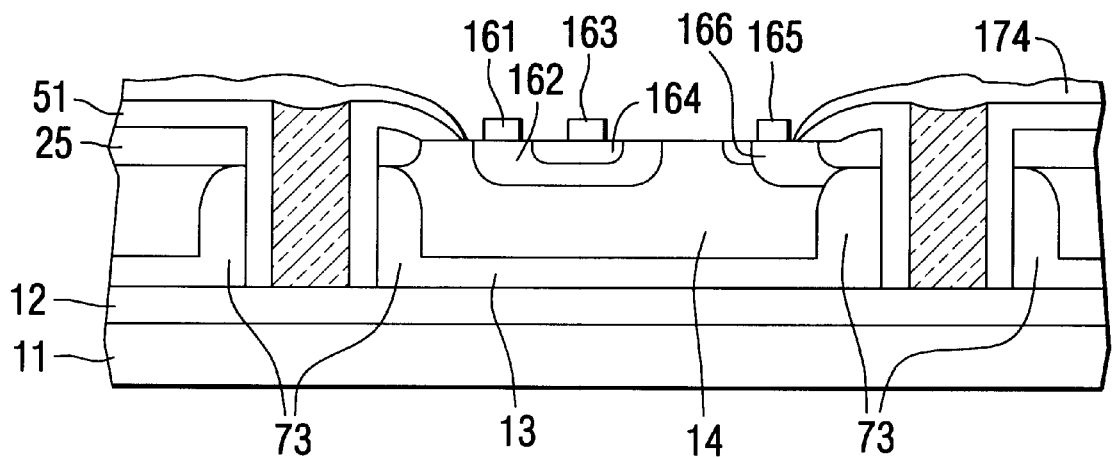
FIG. 16 illustrates a bipolar device manufactured with the method of the invention.

As mentioned above, the description shown in FIGS. 1–15 generally conforms to the process flow of an MOS type device. However, as shown in FIG. 16, the process of the invention can also be used to provide dielectrically isolated trenches in bipolar devices. Thus, the bipolar device has a base diffusion 162 with a base contact 161. Within base diffusion 162 is emitter diffusion 164 of an opposite polarity to the base diffusion. Emitter contact 163 provides electrical contact to the emitter diffusion region 164. A collector contact region 166 makes electrical contact with a sidewall diffusion 73 to provide surface collector contact 165 a low resistance electrical path to a buried conductive layer 13 that is disposed in wafer 17. The trenches are filled with polysilicon material and have sidewall oxide isolating the trenches from the diffusion regions 73, 166, 164 and 162.

The process for forming a bipolar transistor as shown in FIG. 16 provides trench isolation relatively late in the bipolar process. To this end, the trench isolation structures are etched through the LOCOS isolation layer 25. After the trenches are filled with suitable polysilicon or interlevel dielectric material, there are no thick thermal oxidations or deep diffusions. The MOS and bipolar transistors shown in the above drawings may be fabricated together at substantially the same time in so-called BICMOS processes. With the invention, it is also possible to form the trenches and leave them open while thermal oxides are grown. While the trenches are open, one may grow oxides in excess of 500 Angstroms. However, after the trenches are filled, further thermal oxide growth 174 should not exceed 500 Angstroms.

Having thus described our invention in connection with the above embodiments, those skilled in the art will appreciate that further modifications, additions, deletions and changes thereto may be made without departing from the spirit and scope of the following claims.

What we claim is:

1. An integrated circuit comprising a plurality of transistors formed in a surface of a silicon substrate, wherein one or more transistors are dielectrically isolated from other transistors by a buried layer of silicon dioxide in said substrate and by a trench surrounding the transistors, said trench extending from said buried layer of silicon dioxide to the surface of the substrate, at least one isolated transistor having a region of thermally grown silicon dielectric that comprises oxidized portions of the silicon substrate, said trench extending through said region of thermally oxidized silicon, said trench having a side wall with a first thermal oxide layer wherein the trench is filled with polysilicon, and a second thermal oxide layer formed from the polysilicon filling the trench wherein said second thermal oxide layer is not greater than 500 Å thick.

2. The integrated circuit of claim 1 wherein at least one isolated transistor is an MOS transistor.

3. The integrated circuit of claim 1 wherein at least one isolated transistor is a bipolar transistor.

4. The integrated circuit of claim 1 wherein at least two isolated transistors comprise at least one MOS transistor and at least one bipolar transistor.

5. The integrated circuit of claim 1 wherein the integrated circuit further comprises a buried, doped layer above the buried layer of silicon dioxide and a trench wall is silicided to provide a low resistance electrical connection between the buried, doped layer and the surface of the silicon substrate.

* * * * *